United States Patent [19]

Ahuja

[11] Patent Number: 4,710,949
[45] Date of Patent: Dec. 1, 1987

[54] TELEPHONE LINE FAULT LOCATING DEVICE

[75] Inventor: Om Ahuja, Houston, Tex.

[73] Assignee: Om Electronics Systems Corp., Houston, Tex.

[21] Appl. No.: 13,141

[22] Filed: Feb. 11, 1987

Related U.S. Application Data

[63] Continuation of Ser. No. 753,719, Jul. 10, 1985, abandoned, which is a continuation-in-part of Ser. No. 633,107, Jul. 20, 1984, abandoned.

[51] Int. Cl.$^4$ ............................................. H04B 3/46
[52] U.S. Cl. ........................................ 379/26; 309/632
[58] Field of Search ................. 179/175.3 R, 175.3 F, 179/175, 175.1 R, 81 R, 17 A, 99 R; 307/252 B, 252 T; 324/52

[56] References Cited

U.S. PATENT DOCUMENTS

| | | | |
|---|---|---|---|
| 3,916,111 | 10/1975 | Ott | 179/17 E |
| 4,021,617 | 5/1977 | Jones, Jr. et al. | 179/17 E |
| 4,052,624 | 10/1977 | Hamstra | 307/252 B |
| 4,054,942 | 10/1977 | Chambers, Jr. | 179/17 A |
| 4,056,694 | 11/1977 | Brolin | 179/84 R |
| 4,079,205 | 3/1978 | Glenn | 179/17 A |
| 4,099,031 | 7/1978 | Proctor et al. | 179/17 A |
| 4,149,040 | 4/1979 | Atkinson | 179/17 A |
| 4,209,667 | 6/1980 | Simokat | 179/17 A |
| 4,221,935 | 9/1980 | Barsellotti et al. | 179/17 E |
| 4,293,737 | 10/1981 | Cepelinski | 179/17 E |
| 4,310,723 | 1/1982 | Svala | 179/17 A |
| 4,323,799 | 4/1982 | King et al. | 307/521 |
| 4,324,953 | 4/1982 | Simokat | 179/17 A |
| 4,331,838 | 5/1982 | Simokat | 179/17 E |
| 4,350,849 | 9/1982 | Ahuja | 179/175 |
| 4,368,363 | 1/1983 | Ahuja | 179/175.3 R |
| 4,369,341 | 1/1983 | Ahuja | 179/175.2 R |
| 4,373,121 | 2/1983 | Sartori et al. | 119/175.3 F |
| 4,388,501 | 6/1983 | Ahuja | 179/175.3 R |
| 4,396,809 | 8/1983 | Brunssen | 179/175.3 F |
| 4,403,115 | 9/1983 | Simokat | 179/17 A |
| 4,415,779 | 11/1983 | Bowman | 179/175.3 F |
| 4,438,299 | 3/1984 | Tomin | 179/175.3 F |
| 4,445,001 | 4/1984 | Bertoglio | 179/17 A |
| 4,489,221 | 12/1984 | Walker et al. | 179/19 |
| 4,529,847 | 7/1985 | DeBalko | 179/175.3 F |
| 4,605,827 | 8/1986 | Chattler | 179/175.3 F |

OTHER PUBLICATIONS

Undated Schematic Diagram of Western Electric MTU.
*General Electric*, published by Prentice Hall Inc., N.J., "SCR Manual Sixth Edition," pp. 435–436.
*Bell Laboratories Record*, "Switching to Solid State Relays," pp. 31–37, published in Feb. of 1978.
Bell System Publication 55022.

(List continued on next page.)

*Primary Examiner*—Stafford D. Schreyer
*Attorney, Agent, or Firm*—Scully, Scott, Murphy & Presser

[57] ABSTRACT

A fault locating device for determining whether a problem exists on the customer side or the office side of a telephone line. A voltage and current sensitive switch is connected in series with each of the ring and tip lines near the customer side. The voltage and current sensitive switches are activated by a current demand only in the presence of a threshold voltage across the telephone line. The switches include a triac connected in series with each telephone line and a bilateral avalanche device connected to the gate of the triac and the telephone line. The switches will not turn on, and the customer will remain disconnected from the central office if the voltage is below the breakover voltage of the avalanche device. A distinctive termination circuit is connected across the tip and ring lines on the customer side of the voltage and current sensitive switches. The termination circuit conducts only when the ring is positive and the tip is negative. This provides a signature to the central office, indicating the presence of a fault locating device in the customer loop. A test voltage is applied below the threshold voltage of the voltage sensitive switches to test the line with the customer side disconnected to determine which side of the device a fault is located.

51 Claims, 11 Drawing Figures

OTHER PUBLICATIONS

Teccor Electronics, Inc., Phase Control Applications, Bates No. 5440.

Modern Electronic Circuit Reference Manual Chapter 93, Temperature Control Circuits, Bates Nos. 5441–5444.

SCR Manual Sixth Edition, General Electric, pp. 266, 267, Bates Nos. 5406, 5407.

More Telephone Accessories You Can Build, Hadden Book Company, Bates Nos. 5402, 5403.

Control Circuits, Parker Publishing Company, Bates Nos. 5404, 5405.

Bell Laboratories Progress Report Pots—MTU Field Experiment, Bates Nos. 5474–5476.

Disclosure Document No. 119121, filed Jul. 27, 1983 for "Maintenance Termination Unit", (Per Bell Pub.: 55022).

TELEPHONE LINE FAULT LOCATING DEVICE

REFERENCE TO RELATED APPLICATION

This application is a continuation of application Ser. No. 753,719, filed July 10, 1985, now abandoned which is a continuation-in-part of the applicant's U.S. application Ser. No. 633,107 filed July 20, 1984 abandoned.

BACKGROUND OF THE INVENTION

This invention relates generally to the field of telephone communications, and more particularly to a device to determine whether a problem that exists in the telephone line is located on the subscriber side or the network side of the fault locating device.

DESCRIPTION OF THE PRIOR ART

In the past, telephone companies only needed to determine if there was a problem with a subscriber's telephone system since they owned both the telephone lines and the telephones. No matter where the problem existed, it was the telephone company's responsibility to send a repairman out to make the proper repairs. Today, with more and more people owning there own phones and with the devesiture of AT&T, there is a need for the telephone utility to determine whether a problem exists either with their network lines or with the customer's telephone.

In the past, telephone fault locating devices or Maintenance Termination Units (MTU) have utilized mechanical relays to remotely disconnect the subscriber's side of the line in order to test the network side. The principal deficiency of these prior art devices or maintenance termination units (MTU) is that the mechanical relays took too much time to operate and would wear out or freeze relatively quickly requiring constant replacement.

U.S. Pat. No. 4,373,121 issued to Satori et al., discloses a fault detection device having a four layer diode switch connected in series with each of the subscriber loop conductors, tip and ring, of the telephone lines. In addition, identical impedance networks are connected between the loop conductors and ground on the network side of the switches. Each of the networks presents a unique impedance in response to an a.c. signal. In a first set of tests d.c. signals are applied to the loop conductor to determine if a fault exists. In addition, a.c. signals are also applied to the loops and if the unique impedance is detected it is determined that a maintenance termination device is in the line. In order to determine where a problem exists, a second set of d.c. signal tests are performed wherein the voltage is dropped to below the threshold voltage of the four layer diodes so that the diodes will not conduct. If a d.c. current is detected, the problem exists on the utility side of the line.

In U.S. Pat. No. 4,438,299 issued to Tomin, a telephone trouble shooting apparatus is disclosed having two voltage sensitive unilateral solid state switches, one connected to the tip line and the other connected to the ring line. Each of the unilateral switches has a blocking diode for blocking conduction in the direction running opposite that of the direction of conduction of the unilateral voltage sensitive switches. A termination circuit consisting of a resistor 22 and a diode 24 is connected across the tip and ring lines. By using a test voltage below that which the solid state switches will conduct, the customer side of the line is disconnected. Depending on whether or not the resistor 22 or an open circuit is detected upon testing in opposite polarities, it can be determined whether the problem exists on the company side or on the customer side of the apparatus.

SUMMARY OF THE INVENTION

The present invention is directed to a fault locating device or Maintenance Termination Unit (MTU) that is connected in the telephone tip and ring lines at a demarcation point between the telephone central office network and the customer's telephone. The device includes two bilateral solid state voltage and current sensitive switching devices, one switching device connected in series with the tip line and one switching device connected in series with the ring line. In addition, a distinctive polarized termination circuit is connected across the tip and ring lines on the customers side of the device.

In one embodiment, the solid state switching devices include a solid state bilateral switch having a first and a second terminal connected in series with the ring or tip line and a gate for rendering the switch conductive between the two terminals in response to a predetermined current level. A solid state avalanche device is connected between the gate and the second terminal of the bilateral switch to render the bilateral switch voltage sensitive. The avalanche device is responsive to a predetermined voltage level to render the bilateral switch conductive in the presence of the proper gate current. If the voltage across the avalanche device is below the predetermined voltage, the bilateral switch will be prevented from turning on. The avalanche device is bilateral and can normally pass ac and dc signals. The bilateral switching device of the present invention can be used to disconnect the subscriber side of a telephone system for testing the line to determine whether a fault is located on the network side or the customer side of the line.

The distinctive polarized termination circuit includes a diode that permits conduction through the termination circuit only from ring to tip, when the ring polarity is positive and the tip polarity is negative. In normal telephone operation, tip is positive and ring is negative so that the termination circuit will not be seen by the telephone central office. Once a problem has been determined to exist, the polarity is reversed so that the termination circuit will conduct. This will provide the distinctive signature at the central office which will indicate that there is a fault locating device on line.

To determine where the problem exists, a test voltage below the breakover voltage of the avalanche device is provided across the tip and ring circuit to prevent the voltage sensitive switches from turning on. The line is then tested for a short and if the short is detected, the central office knows that the problem exists on the network side. If an open circuit is detected, then the central office knows that the problem exists on the customer side.

In another embodiment, the voltage sensitive switches include a field effect transistor connected within each of the tip and ring circuits and a resistance-capacitance time constant circuit for normally energizing the FETs. The capacitor is charged by a control voltage from the central office which sustains the FETs in the energized state for as long as the capacitor in charged. A diode bridge is included to provide proper polarity to the capacitor and the FETs regardless of the polarity of the control voltage across the tip and ring. A means for discharging the capacitor in response to a second control voltage from the central office renders the FETs nonconductive. The time, determined by the RC time constant, for the capacitor to recharge, permits the central office to test the network side of the telephone line for faults. Since the FETs are nonconductive during the charge time, the customer side of the line is disconnected and the central office can determine where the fault exists.

DETAILED DESCRIPTION OF THE PRESENT INVENTION

Figure 1:
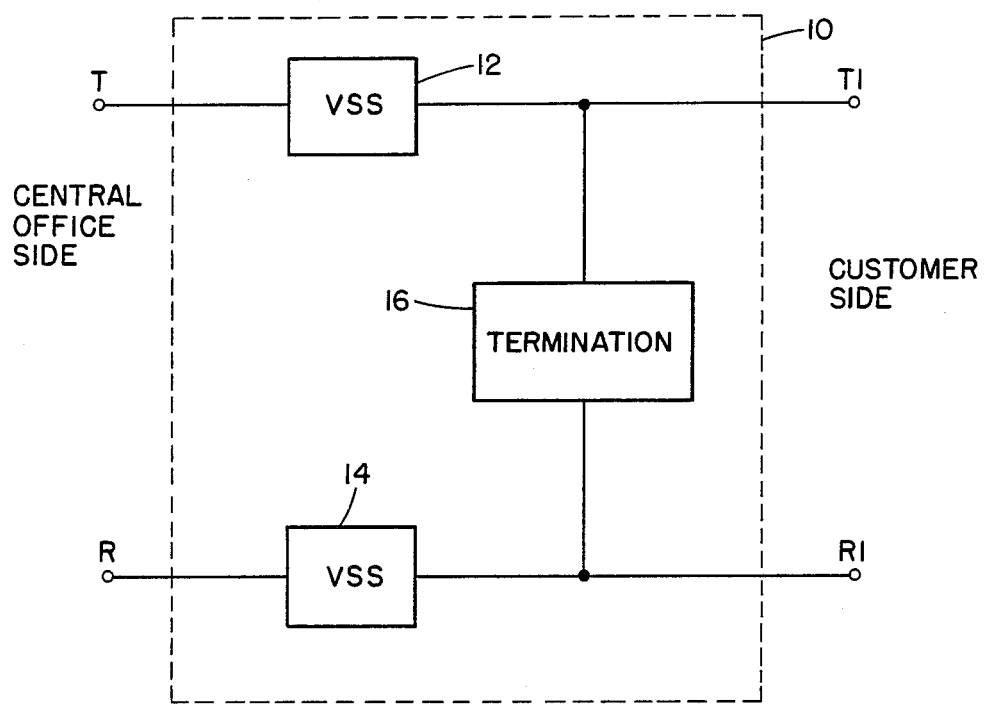
FIG. 1 is a block diagram of the fault locating device of the present invention.

FIG. 1 shows the environment in which the device of the present invention is located. The device 10 is located within the telephone lines that extend from the central office to the customer's phone. The telephone line include two lines designated tip and ring, terminal T for tip and terminal R for ring designate the central office side of the device 10. Terminal T1 and R1 designate the customer side of the device. The device 10 includes a voltage and current sensitive switch 12 connected in series with the tip line and a voltage and current sensitive switch 14 connected in series with the ring line. The device 10 also includes a distinctive polarized termination circuit 16 which is connected across the tip and ring lines on the customer side of the voltage sensitive switches 12 and 14.

The voltage and current sensitive switches 12 and 14 will not activate unless a voltage that is equal to or greater than a particular threshold voltage is present across each switch. Therefore, both switches 12 and 14 will not activate unless a voltage greater then the combined threshold voltage is across tip and ring. The switches 12 and 14 are transparent to a voltage on the line greater than the threshold voltage while not being in a fully conductive state. Once the threshold voltage is present, switches 12 and 14 may be triggered on to full conduction by a current in the line drawn by the telephone being off hook or by the application of a ringing voltage by the central office. The current on the line must be equal to or greater than a current level called the gate trigger current to render the switch fully conductive. Thereafter, a current level lower than the gate trigger current, termed the latching current, must be present on the line to sustain the switches in a fully conductive state. Once the switches 12 and 14 are on, the voltage in the line may drop substantially but the switches 12 and 14 will remain on until the current drops below a given minimum termed the holding current, a current level between the gate trigger and latching current levels. The voltage and current sensitive switches can be turned off by reducing the voltage below the threshold level for a sufficient period of time to permit the current to drop below the holding current. The customer side of the tip and ring lines can be remotely disconnected by the central office by removing the voltage across tip and ring causing the current to drop to zero. A test voltage below the threshold voltage can be placed on the tip and ring lines by the central office, to test the network side of the telephone system for a possible fault.

Normally, the central office maintains a talk battery voltage, approximately 48 volts dc, across the tip and ring line at all times. The threshold voltage of switches 12 and 14 is selected so that the combined threshold voltage is below the talk battery 48 volts. Preferably, the threshold voltage of each switch is 16 volts. No current is flowing in the line while the phone is on hook and therefore, the switches 12 and 14 will not be fully conductive but transparent to pass the talk battery voltage to the customer's phone. Upon a demand for current by the phone being placed off hook, the switches 12 and 14 will turn on provided there is sufficient voltage across tip and ring which exceeds the combined threshold voltages of the voltage sensitive switches 12 and 14. The current draw alerts the central office to provide a dial tone on the line. In addition, to ring the customer's phone, the central office applies an ac ringing voltage, nominally 100 volts, that actuates a ringer mechanism in the phone. The actuation of the ringer mechanism generates a demand for current that turns on the switches 12 and 14. Thus, in the normal on hook condition, the switches 12 and 14 are nonconductive.

When testing the line, the central office test desk will remove the 48 volt talk battery voltage and apply a 60–100 volt test battery voltage. The voltage is applied between each line and ground and across the line. The 60–100 volts being greater than the 16 volt line threshold and 32 volt line to line threshold voltage of the switches 12 and 14, permits the test desk to test the line to the customer's phone. The test desk then removes the 60–100 volt test battery and applies a 10 volt test voltage. The 10 volts is below both the line and line to line threshold voltages and therefore, the switches 12 and 14 will not pass the voltage. The threshold voltage of the switches 12 and 14 prevents the switches from becoming conductive due to a fault induced loop current. The presence of a short on the customer side of the device 10 may generate a current that would otherwise turn on the switches 12 and 14. With the switches 12 and 14 rendered nonconductive, the test desk can test the network side of the line to determine the location of any faults detected during the 100 volt test. If the fault is seen again at the low voltage test the central office knows that the fault is on the network side. If the fault is not seen, the fault is on the customers side.

Normally, the tip line is at positive and the ring line is at negative so that current will flow from tip to ring. The distinctive termination circuit 16 is reverse biased so that current will be blocked in the direction from tip to ring, but allowing current to flow from ring to tip. Therefore, in normal telephone operations, the termination circuit 16 will not be conducting. In testing for a fault, the central office will reverse the polarities so that the ring is positive and the tip is negative enabling current to flow through the termination circuit 16. The termination circuit 16 produces a distinctive signature that can be seen by the central office. Thus, while testing the lines, the central office will be able to determine whether a fault locating device is located at the termination of the telephone company line.

Figure 2:
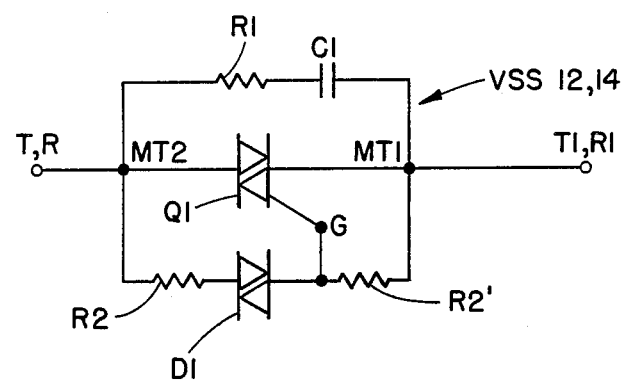
FIG. 2 is a schematic diagram of one embodiment of the voltage sensitive switch of the present invention.

FIG. 2 shows a preferred embodiment of the voltage and current sensitive switches 12 and 14. The voltage and current sensitive switchs in FIG. 2 includes a solid state bilateral switch Q1, such as a triac, having two terminals MT1 and MT2 connected in series with the tip or ring line and a gate G for rendering the triac conductive. The switch Q1 will be turned on in response to a specified gate trigger current. A solid state avalanche device D1, such as a diac or two zener diodes back to back, is connected in series with the gate G of the triac Q1 to condition the turn on of triac Q1 on the presence of a predetermined threshold voltage. The diac D1 is connected between the gate G and the terminal MT2 of the triac Q1. Preferably, a resistor R2 is connected in series with the diac D1 to limit the current flow through the gate G. The avalanche device D1 conducts in either direction only when the voltage across it exceeds a specified breakover voltage. Optionally, a resistor R2' may be connected between the gate G and terminal MT1. The resistor R2', if connected into the circuit, provides noise and transit immunity, preventing switch 12, 14 from inadvertently turning on.

The switch Q1 will be conductive only when the voltage across the remote circuit is equal to a predetermined threshold voltage equal to the breakover voltage of the avalanche device D1 and the gate trigger voltage of the switch Q1. As noted above, the breakover voltage of D1 is preferably set at 16 volts. In the off hook condition, with the two switches 12 and 14 connected in the tip and ring lines as shown in FIG. 1, the presence of a voltage across tip and ring greater than the combined threshold voltages of switches 12 and 14 will produce a loop current proportional to the voltage in excess of the combined threshold voltages and the combined loop and phone impedance. If the loop current exceeds the gate trigger current, switch Q1 in both switches 12 and 14 will turn on. The switches Q1 are selected to have a gate trigger current lower than the current produced by the excess voltage above the 32 volt combined threshold voltage and the maximum permissable loop resistance of approximately 2000 ohms. Once switches Q1 are turned on, the diacs D1 are bypassed by the triacs Q1 and the voltage drop across the switches 12 and 14 reduces to the one state voltage of the switch, which is approximately one volt. The on state loop current then increases to the proportion of the talk battery and the combined loop impedance. The latching current of the triacs Q1 is selected to be lower than the minimum on state loop current.

Furthermore, a resister R1 and a capacitor C1 may be connected in series across terminals MT1 and MT2 of the triac Q1 to protect the triac Q1 from any surge or transient voltages. The capacitor slows the rise time of the voltage across the switch Q1 thereby reducing the potential damage caused by a surge voltage. The resistor R1 attenuates the current flowing to and from capacitor C1. In addition, the RC circuit across MT1 and MT2 helps minimize any voice level insertion loss due to the switch being placed in the tip and ring circuits.

Figure 3:
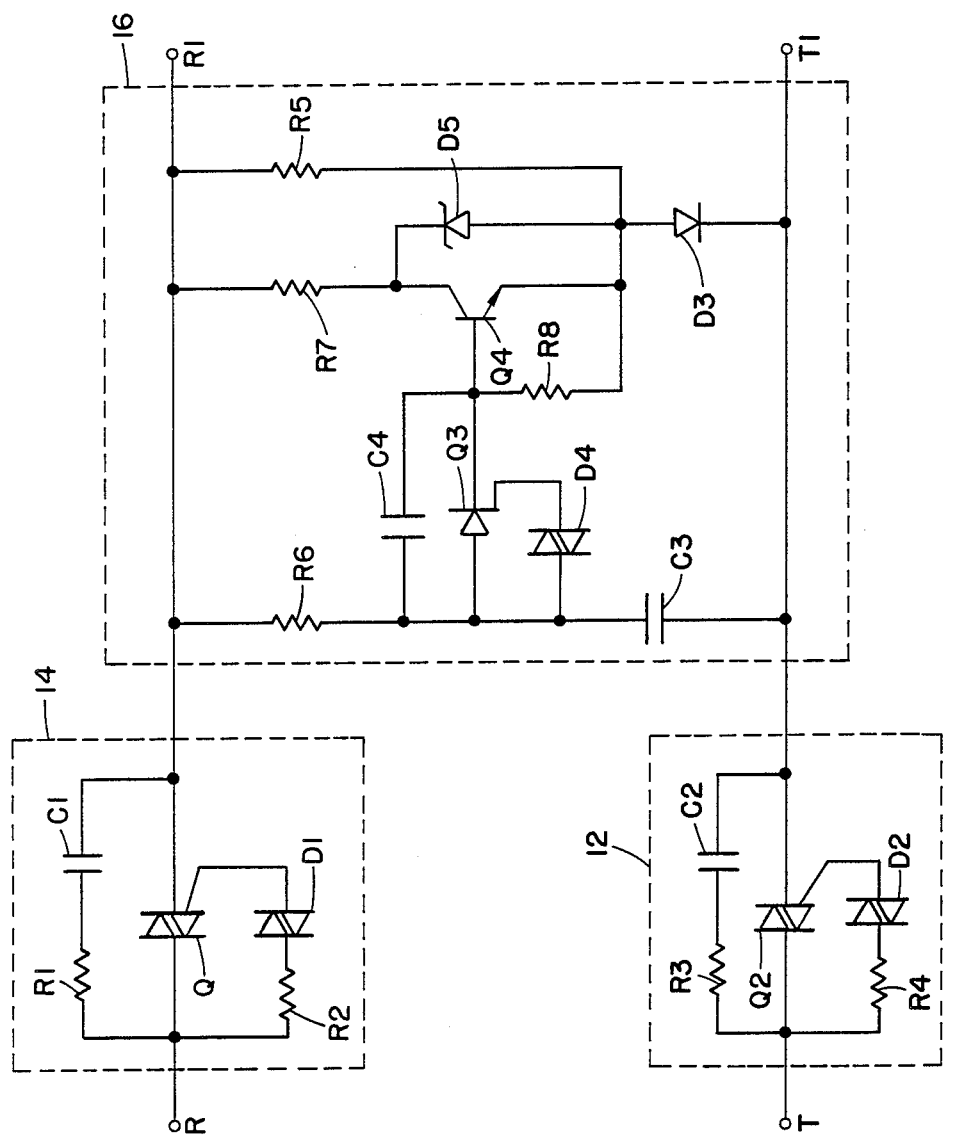
FIG. 3 is a schematic of one embodiment of the fault locating device of the present invention.

As shown in FIG. 3, the voltage and current sensitive switches 12 and 14, identical as shown in FIG. 2 but without the optional resistor R2', are connected within the tip and ring lines. As mentioned above, the termination circuit 16 produces a distinctive signature, when conducting, that is seen by the central office. The distinctive signature of the circuit shown in FIG. 3 will be a "wiggle" which will be seen at the central office as an oscillation of a test meter. The circuit 16 has an equivalent resistance that is alternately reduced and increased. Termination resistor R5 is normally always within the circuit 16. A wiggle resistor R7 is alternately brought in parallel with the resistor R5 and out of the circuit thereby causing the equivalent resistance of the circuit 16 to oscillate between two values. An SCR Q3 is triggered by a diac D4 which turns on a transistor Q4 thereby bringing wiggle resistor R7 within the circuit. A d.c. voltage applied with ring positive and tip negative greater than the breakover voltage of the diac D4 will charge capacitors C3 and C4 until diac D4 avalanches. As noted above, the threshold voltage of switches Q1 and Q2 is 16 volts. The breakover voltage of device D4 is also set at 16 volts. Therefore, the ring to tip voltage must exceed 48 volts to trigger device D4. The 60-100 volt test battery is sufficient to avalanche device D4.

Diac D4, once in conduction, passes the gate trigger current to turn on SCR Q3. SCR Q3 provides the bias current to turn on transistor Q4. Once SCR Q3 is on, capacitors C3 and C4 discharge through SCR Q3 and the base emitter of transistor Q4 and diode D3. Capacitor C4 provides the holding current for the SCR Q3 to hold Q3 on until the capacitor C3 is discharged, at which point SCR Q3 will turn off. Transistor Q4 will then turn off and resistor R8 keeps transistor Q4 off until there is current flow through Q3. When transistor Q4 is off, the resistor R7 is removed from the circuit. The resistor R6 will start to charge the capacitor C3 again and upon reaching the threshold voltage of the diac D4, the cycle will start to repeat again. The transistor Q4 is a standard high voltage low leakage transistor with a a zener diode D5 connected across the collector and the emitter to prevent secondary breakdown of the transistor Q4.

Diode Q3 provides the polarization of the termination circuit 16 by only permitting the circuit to conduct when the ring is positive and the tip is negative. A termination resistor R5 will always be on when the ring is positive, and with the wiggle resistor R7 turning on and turning off, the equivalent resistance of the circuit 16 will oscillate between two values. The oscillation will be seen at the central office test meter by the needle moving back and forth between the two resistance values.

In the case where the device is incorrectly connected within the tip and ring loop so that the blocking diode D3 conducts from tip to ring, diac D4 prevents the termination circuit 16 from conducting in the normal talk and on hook modes. The breakover voltage of diac D4 together with the breakover voltage of the diacs D1 and D2 is designed to be greater than the talk battery voltage. Therefore, in the talk mode, the talk battery voltage is sufficient to breakover diacs D1 and D2 but not diac D4. In the on hook mode, diac D4 prevents a current flow through the termination circuit that would otherwise put a drain on the central office talk battery voltage.

The capacitor C3 and resistor R6 provide a.c immunity to the circuit 16. Unless there is a d.c. voltage across the line, capacitor C3 will alternately charge and discharge according to the R6, C3 time constant, thus never reaching the threshold voltage to breakover diac D4. Therefore, SCR Q3 and transistor Q4 will not turn on in the presence of an a.c. signal. However, resistor R6 and capacitor C3 do provide an a.c. impedance which may be detected as a signature on the line in the absence of the impedance of the telephone ringer on the customer side.

Figure 6:
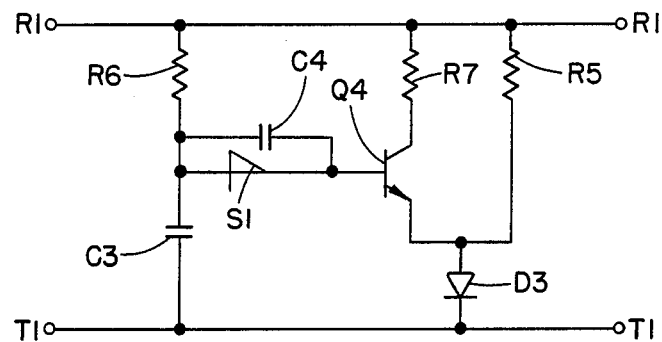
FIG. 6 is a schematic of another embodiment of the termination circuit.

It should be understood that the distinctive circuit 16 in FIG. 3 is only an illustrative circuit and many alternatives are possible without departing from the concepts of the present invention. For example, the diac D4 may be replaced by a zener diode or both the SCR Q3 and diac D4 may be replaced by a silicon unilateral switch. FIG. 6 shows the termination circuit 16 with a silicone unilateral switch S1 for turning on the Transistor Q4.

Figure 7:
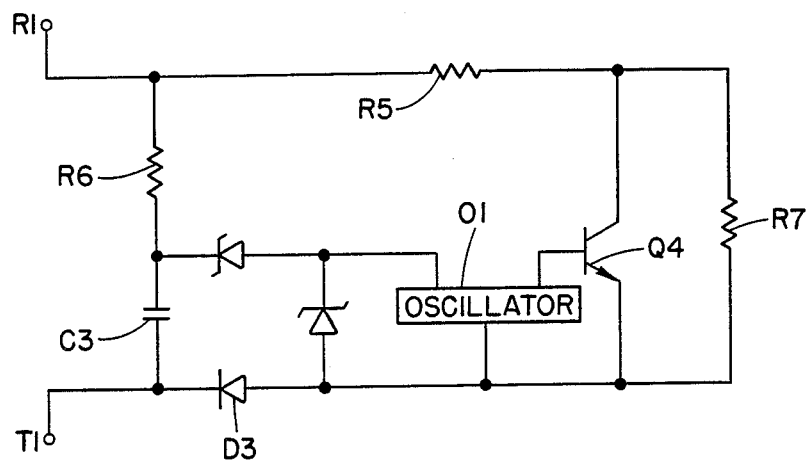
FIG. 7 is a schematic of a termination circuit using a solid state oscillator.
Figure 8:
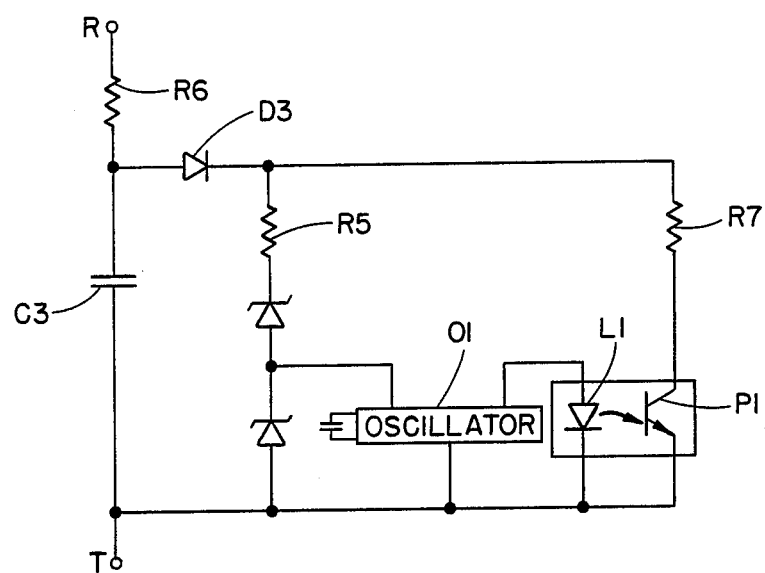
FIG. 8 is a schematic of a termination circuit using an LED.

FIGS. 7 and 8 are further examples of termination circuits 16. The FIG. 7, a solid state oscillator $O_1$, preferably a low voltage oscillator contained in a single integrated circuit package, alternately turns transistor Q4 on and off. Transistor Q4 places a short across resistor R7 when turned on. Thus, resistor R7 will be alternately placed in and out of the circuit, producing a wiggle at the central office meter equivalent to the resistance value of R5 and alternately R5 and R7 in series. In FIG. 8, the oscillator $O_1$, actuates an LED L1 which turns on phototransistor P1 to bring resistor R7 within the circuit in parallel with R5 to produce the wiggle.

Figure 4:
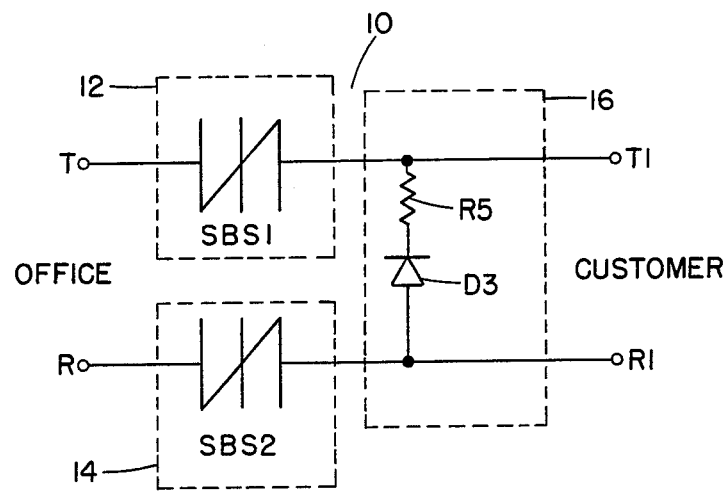
FIG. 4 is a schematic of another embodiment of the fault locating device using sidacs.

FIG. 4 shows a simplified embodiment of the fault locating device 10 wherein the voltage sensitive switches 12 and 14 are sidacs SBS1 and SBS2. The sidacs are commercially available in a breakover voltage range of 95–250 volts. However, sample sidacs have been provided by Teccor Electronics for test purposes rated at 16 volts breakover voltage. The termination circuit 16 consists of a resistor R5 and a diode D3. When the normal polarity is reversed so that the ring is positive and tip is negative and the test voltage is greater than the threshold voltage for switches 12 and 14, the diode D3 will be forward biased and the resistor R5 will be measured by the test system, thereby indicating the presence of a fault locating device with the system.

Figure 5:
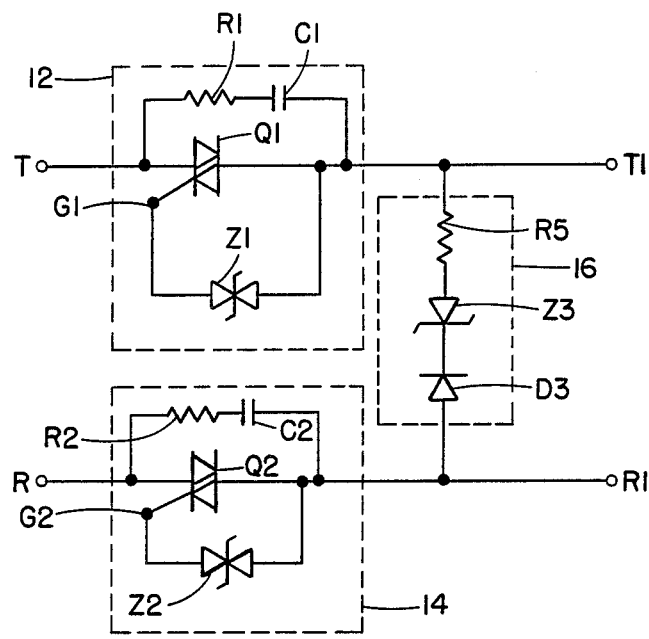
FIG. 5 is a schematic of another embodiment of the fault locating device of the present invention.

FIG. 5 shows another embodiment of the fault locating device 10 wherein the avalanche devices Z1, Z2 include two zener diodes placed back-to-back. The termination circuit 16 includes a resistor R5, a zener diode Z3, and diode D3. Zener diodes in larger variety of avalanche voltages are more readily available than diacs thereby making the device of this embodiment commercially practicable. The back-to-back zener diodes Z1 and Z2 provide turn on of switches Q1 and Q2 respectively for both polarities and for both AC and DC voltage. The zener diode Z3 performs the same function as diac D4 in FIG. 3, if the device is connected in the incorrect polarity across tip and ring.

In operation, when a customer calls in with a complaint of a problem with his phone the central office will first remove the talk battery voltage, approximately 48 volts, normally on the line and place a 60 to 100 volt dc test voltage on the line. With this test voltage, the technician will test from tip to ring, from tip to ground, and from ring to ground to test for a short. If there is a short on the customer side, which is line to line or line to ground, there will be a small current flow sufficient to turn on the gate of the switches Q1 and Q2 since the test voltage is sufficient to breakover avalanche device D1 and D2. The current in the loop may or may not be sufficient to put switches Q1 and Q2 into full conduction. The same three tests will be performed with the polarity reversed to test for diode shorts. In addition, when the polarity is reversed the termination circuit 16 will conduct since the test voltage is sufficient to breakover devices D1, D2 and D4. Therefore, the distinctive signature will be seen at the test desk, and the central office will know that a fault locating device 10 is within the line.

In order to determine the location of the fault the technician at the test desk will drop the voltage below the threshold voltage of the switches 12 and 14. As noted above, the threshold voltage can be set to 16 volts. In addition, the threshold voltage of the termination circuit 16 is also 16 volts. Thus, the test voltage will be dropped down to approximately 10 volts on each line. Since the 10 volts is below the 16 volts needed to have the diac D1 trigger the triac Q1, the switches 12 and 14 will not turn on. In the transfer from 100 to 10 volts, the voltage is dropped to zero momentarily. This ensures that the switches $Q_1$ are turned off when the testing is performed. It should be noted that before any further tests are performed, there must be a small waiting period to permit the current in the switches to reduce to zero to turn the switches off. With the switches 12 and 14 turned off, the customer side of the tip and ring lines are disconnected. The six tests are again performed at the lower voltage, tip to ring, tip to ground, and ring to ground for both polarities and if a short is still seen, the central office will know that the problem exists with the central office side of the line. If an open circuit is seen, then the problem exists on the customer side of the line.

In another testing system, the test voltage may be progressively raised from 0 to 60 volts d.c. or higher. The three line to line and line to ground tests in both polarities are first performed with the application of a test voltage of 16 volts or less. Since the avalanche device will not breakover, this test will indicate the condition of the line on the network side. Secondly, the voltage is increased to between 16 and 32 volts and the loop is tested for line to ground condition in both polarities. Only the avalanche device in the line being tested will breakover, since there is insufficient voltage to breakover more than one device. This second test will permit measurement of line to ground faults on the customer side. Thirdly, the test voltage is further increased to between 32 and 48 volts and the loop is tested from line to line in both polarities. Both avalanche devices in the tip and ring lines will avalanche to permit measurement of any fault condition across line to line on the customer side. Lastly, the test voltage is increased to exceed 48 volts, which, in the ring to tip polarity, will cause the avalanche device in the termination circuit to also breakover so that the signature will be verified at the test desk. This system is well suited for an automated test mechanism such as Mechanized Loop Testing (MLT).

Figure 9:
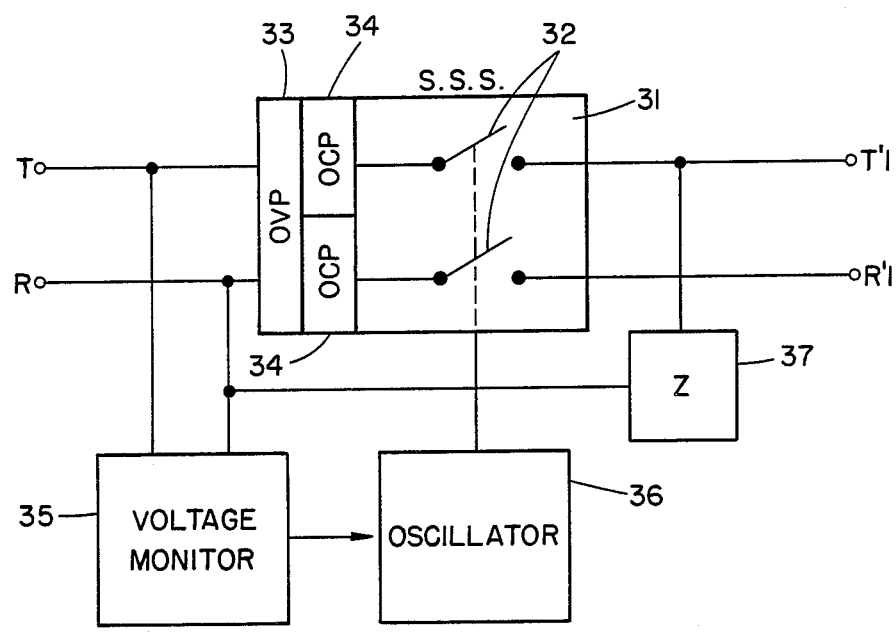
FIG. 9 is a block diagram of a fault locating device using field effect transistors.

A fault locating device using FETs is illustrated in the Block diagram shown in FIG. 9, which includes a solid state switch 31 having at least one unilateral switch 32 in each tip and ring circuit. The switch 31 also includes an overvoltage protection (OVP) means 33 and an overcurrent protection (OCP) means 34 for each unilateral switch 32. A voltage monitor 35 is connected across the line which controls an oscillator 36. When activated by the voltage monitor 35, the oscillator 36 alternately turns on and off the switch 31. A polarized termination 37, having an impedance Z is also connected into the circuit. Thus, only with ring positive does the termination 37 becomes connected into the circuit. When the ring is positive and tip is negative, the termination 37 is connected in and out of the circuit as the switch 31 is turned on and off alternately by the oscillator 36.

The voltage monitor 35 is designed to activate the oscillator 36 only upon the detection of the 60-100 volt test voltage. When the test voltage is applied, the oscillator 36 turns the switch 31 on and off. During the period when the switch 31 is on, the test desk is able to test the line for faults to the customer phone. During the period the switch 31 is off. The customer side of the device is disconnected and the test desk is only able to test the network side for faults.

Figure 10:
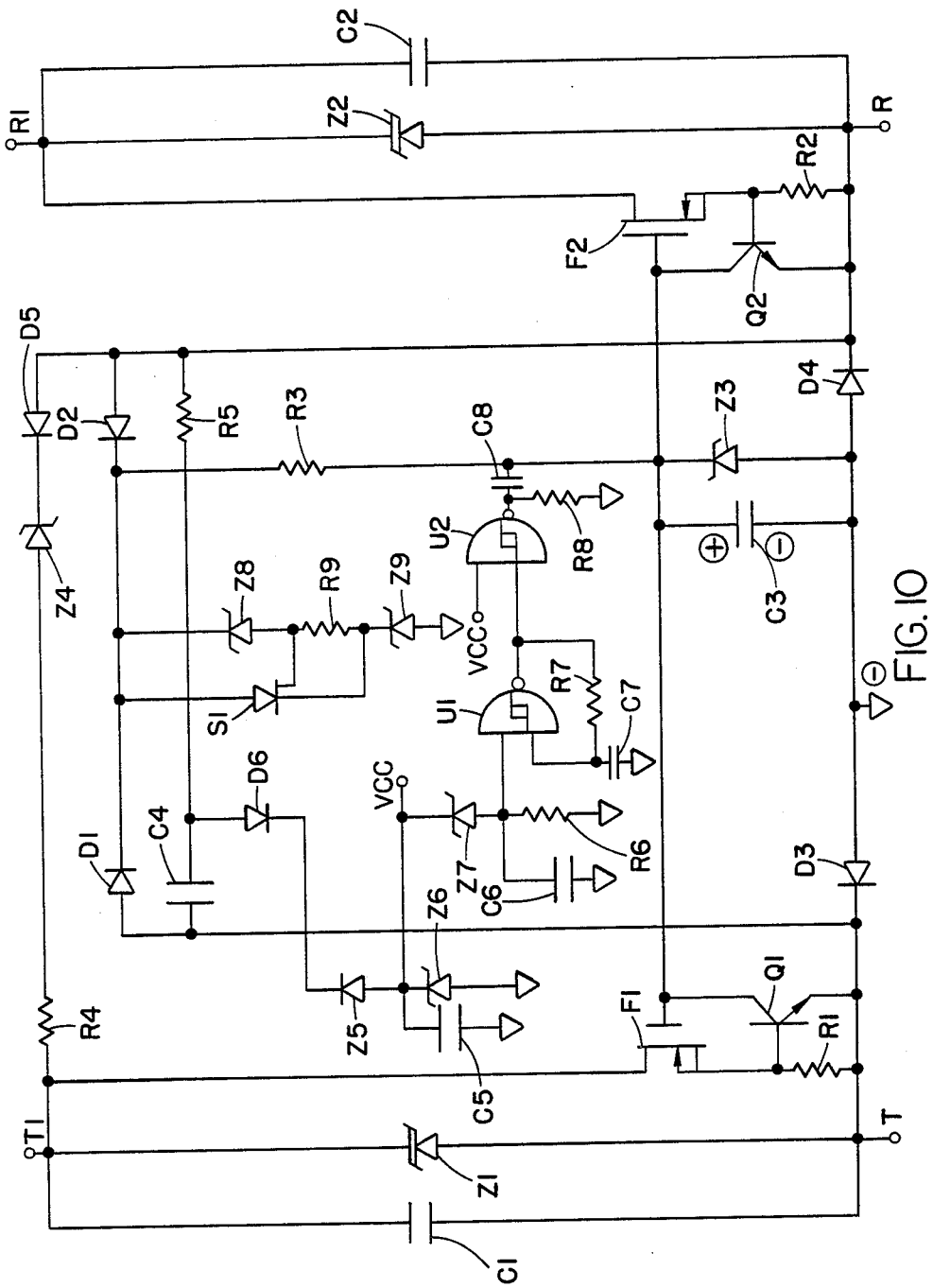
FIG. 10 is a schematic of a fault locating device using FETs.

FIG. 10 is the schematic embodying the above-mentioned functional blocks of FIG. 9. Since many of the components of the blocks of FIG. 9 are separated in FIG. 10, the blocks are not shown in FIG. 10 but the components that make up each block are described hereinafter. It should also be noted that the symbol of the triangle pointing toward the bottom of FIG. 10 in several places indicates a common potential of zero volts. The switch 31 includes the unilateral solid state switches 32 shown as field effect transistor F1 and F2. Shown in this application are N-Channel FETs which in actual practice may be replaced by P-Channel FETs, or by a bilateral solid-state switch configuration having an N and P Channel FET connected in each tip and ring line, as described in the applicant's copending application entitled Remote Actuated Switch, Ser. No. 753,704. A resistor R3 and a capacitor C3 forms an RC time constant circuit for normally energizing the FETs F1 and F2. The voltage across tip and ring is fed through the resistor R3 and charges the capacitor C3 to energize the FETs F1 and F2. The capacitor C3 sustains the FETs F1 and F2 on for the time the capacitor C3 remains charged. Thus, during normal talk battery conditions, FET F1 or F2 will be on. The oscillator 36 momentarily discharges the capacitor C3 to turn off the FETs F1 and F2 to disconnect the subscriber side of the device. During the time the capacitor C3 is recharged by the line voltage, the test desk can test the network side of the line.

The switch 31 further includes the diodes D1, D2, D3, and D4 which form a bridge circuit which rectifies the voltage available across the tip and ring telephone line, and feeds the positive potential through the resistor R3 to the capacitor C3 connected to the gates of the FETs F1 and F2. The bridge insures that the capacitor C3 is charged to the proper polarity with the positive end being connected to the gates of the FETs F1 and F2. The negative end of the capacitor C3 is connected to the negative end of the bridge circuit. A zener diode Z3 limits the voltage build across the capacitor C3 and consequently across the gates of the FETs. Transistor Q1 together with resistor R1 and transistor Q2 together with resistor R2 form the overcurrent production means 34 and protect FETs F1 and F2 respectively from overcurrent. SCR S1 together with zeners Z8 and Z9 and resistor R9 form the basis of overvoltage protection 33 for the entire circuit.

The voltage monitor 35 includes a diode D6 and zeners Z5 and Z6 which form the basis of the test voltage detection, while resistor R5 provides the current limiting and together with C4 provides the AC voltage and noise immunity to the voltage detection circuit 35.

U1 and U2 are Schmitt Trigger Nand gates as provided by standard C-MOS type IC circuits. U1 and U2 together with the affiliated components zener Z7, capacitors C6, C7, and resistors R6, R7 form the oscillator 36, while capacitor C8 and resistor R8 form the interface between the oscillator 36 and the solid state switch 31.

Diode D5 is a polarizing diode and together with zener Z4 and resistor R4 form the termination circuit 37 shown in FIG. 9.

The switches F1 or F2 will be energized by the resistance-capacitance time constant circuit R3, C3, depending on the polarity of the voltage across tip and ring. If the tip terminal T is positive, F2 will be turned on by the voltage across the capacitor C3 and if the ring terminal R is positive F1 will be turned on by the voltage across the capacitor C3. Protective elements zeners Z1 and Z2, provide a path for the flow of the loop current in the line that is positive in addition to protecting the FETs from overvoltage Thus, if terminal T is positive, zener Z1 carries the current to terminal T1, and the return current from the telephone or station set arriving at terminal R1 flows through switch F2 and resistor R2 and back to the central office through terminal R. Similarly, for terminal R positive, the current flows through zener Z2 and switch F1 and resistor R1 and back to terminal T. Capacitor C1 provides protection from transient voltage and minimizes insertion loss as previously described in connection with FIG. 2.

If tip is positive the current returns through switch F2 and resistor R2. If this current is such that the voltage drop across the resistor R2 exceeds the base emitter junction voltage of the transistor Q2, the transistor Q2 turns on and shorts the gate voltage of the FET F2, turning FET F2 off, which reduces the flow of current through resistor R2. Consequently, the reduced base emitter voltage turns off transistor Q2 which then permits switch F2 to turn on again. In a continuous loop this provides current regulation through the loop, thus protecting all components in the loop from an overcurrent condition. Similarly, switch F1, resistor R1, and transistor Q1 protect the circuit from overcurrents when ring is positive.

SCR S1 provides overvoltage protection across tip and ring. Diodes D1, D2, D3, and D4 bridge rectify the voltage across tip and ring. The voltage across tip and ring is also applied across zener Z8, resistor R9 and zener Z9.

As the voltage exceeds that of zeners Z8 and Z9 together, SCR S1 is triggered by the build up of voltage greater than the gate trigger voltage across the resistor R9. The SCR S1 is triggered and bypasses the voltage across zener Z8 and the voltage across tip and ring is essentially limited to the voltage across zener Z9. As the overvoltage condition ceases, S4 will no longer have sufficient holding current and will turn off, thus returning the overvoltage circuit to the normal condition.

The voltage monitor 35 actuates the oscillator 36 upon detection of a specified voltage to create the wiggle signature. This wiggle is produced upon the application of a specified test voltage applied across the line by the central office. The voltage is first filtered by resistor R5 and capacitor C4. An AC voltage across C4 will not build up to the required voltage to avalanche the zeners Z5 and Z6. Only with a dc voltage greater than Z5 and Z6 together will there be a flow of current through the voltage monitor 35. Capacitor C5 will begin to charge until zener Z6 breaksover. The voltage across capacitor C5 is the voltage supply for oscillator 36.

The oscillator 36 includes NAND gates U1 and U2 that operate when a minimum test voltage is applied. Zener Z7 insures that U1 does not begin to oscillate until the minimum voltage is available for the IC to operate properly. Until such time, capacitor C6 and resistor R6 keep one input of the Schmitt trigger NAND gate U1 at a low level. The other input of this gate U1 is within the feedback loop formed by resistor R7 and capacitor C7. This forms an oscillator the preferred frequency of which is set at 3 Hz.

NAND gate U1 drives NAND gate U2 which is used as an output driver. NAND gate U2 is coupled to the solid state switches F1 and F2 through capacitor C8 and resistor R8. In the absence of adequate supply voltage for NAND Gates U1 and U2, capacitor C8 is maintained at a steady low through resistor R8. Thus, in normal talk, on hook and ring modes the oscillator is dormant. Should NAND gate U2 output start to oscillate driven by Gate U1, capacitor C8 will push-pull capacitor C3 thereby turning the FET, F1 or F2, on and off cyclically at a 3 Hz rate. If the output of Nand gate U2 is low, capacitor C8 begins to change from resistor R3 and capacitor C3, which puts a momentory short across capacitor C3 shorting the gates of the FETs F1 and F2. When the output of gate U2 is high, both sides of capacitor C8 are at a positive potential, shorting capacitor C8 and allowing the capacitor C3 to again be charged by the line voltage.

Each time FETs F1 or F2 are on all the impedances in the telephone loop are visible to the central office test and measurement system, while when F1 and F2 are off, only the impedances on the network side are visible, thus providing the valuable information on the loop condition.

In the absence of any fault conditions on the loop, the central office test vehicle would be at a loss to know if any fault locating device is on the line. Thus, the termination circuit 37 formed by the steering diode D5 the zener Z4 and resistor R4 are also added to the circuit. The impedance of the termination circuit 37 is fixed and known and is recognized by the central office test and measurement system as a signature. The turning on and off of the switches F1 or F2 further produces the turning on and off of the termination circuit 37 providing a wiggle of the signature at the central office which provides an added verification that the fault locating device is in circuit.

Figure 11:
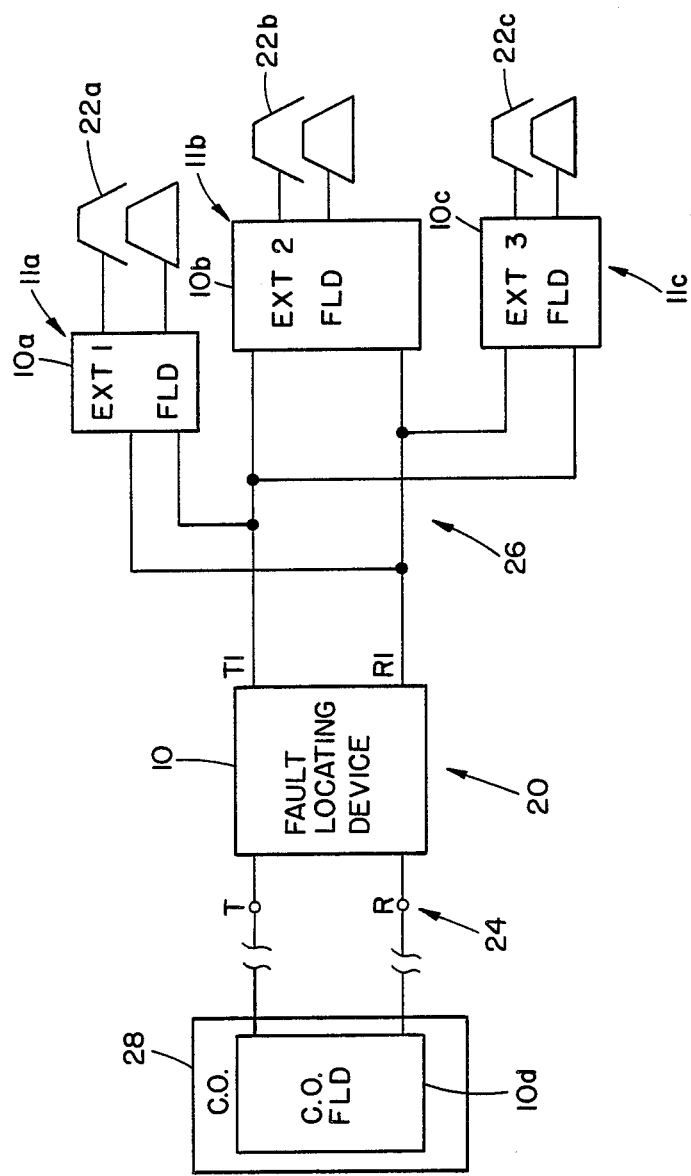
FIG. 11 is a block diagram showing the use of the fault locating device of the present invention at each extension phone.

FIG. 11 shows a preferred embodiment having a fault locating device 10 connected within the tip and ring lines at a demarcation point or network interface 20 separating the central office network line 24 from the customer inside wire 26. Additional fault locating devices 10a, 10b and 10c, one for each of the customer's extension phones 22a 22b 22c are connected in series with the subscriber circuit at extension jacks 11a, 11b and 11c.

In addition, another fault locating device 10d may be connected within the central office 28 connected to the mainframe of the central office. Each of the fault locating devices has a voltage and current sensitive switch responsive to a threshold voltage for rendering the switches conductive only at a voltage above the threshold voltage. In order to sectionalize the testing of the telephone system, the threshold voltage of the voltage and current sensitive switches of each fault locating device, starting at the central office, must be successively exceeded. Thus, in a first test, the condition of the line within the central office is tested by a test voltage below the threshold voltage of fault locating device 10d. The condition of the central office network line is determined with a test voltage above the threshold voltage of device 10d but below the sum of the threshold voltages of devices 10d and 10. The condition of the inside wire is determined with a test voltage above the sum of the devices 10d and 10 threshold voltages but below the sum of devices 10d, 10 and one extension device 10a, 10b or 10c. Finally, the condition of the line and equipment beyond the extension jack is determined with a test voltage above the sum of the threshold voltages of devices 10d, 10 and any one extension device 10a, 10b or 10c.

Another use of the devices 10 shown in FIG. 11 is as an exclusion device used on a telephone line shared by several users. The devices 10a, 10b, 10c when used as an exclusion device may or may not include a termination circuit. In addition, the exclusion device need only have one voltage and current sensitive switch connected within the subscriber circuit. Each user with an exclusion device in series with his line is excluded from using or coming onto the line if the line is already in use by another user, with or without an exclusion device in series with his line. This forms the basis of a privacy arrangement on a shared line. Extensions without the exclusion device in series may come on the line at any time, even if the line is already in use.

The exclusion feature is due to the lowering of the voltage across tip and ring, with one of the sets in the off-hook condition. When a phone is off hook, the system includes the resistance of the loop from the central office to the customer side. The combined trigger voltage, typically 32 volts, of the switches Q1 and Q2 must be greater than the nominal maximum voltage available across tip and ring in the off hook condition. With one telephone set off-hook, the maximum voltage across tip and ring will be typically 24 volts, which is below the central office talk battery, typically 48 volts. Thus, any phone or data set together with an exclusion device in series with it will not be able to cut into an on going voice or data conversation, due to the fact that the switch or switches Q1 and Q2 cannot be turned on due to the lack of sufficient voltage across the line. However, the instant the user hangs up, the line will be released due to reverting of the voltage across the line to the full available talk battery voltage. The switch or switches Q1 and Q2 will immediately cut into or seize the line, if already in the off-hook condition, thus being able to transfer the call from the first user to the later user.

While illustrative embodiments of the subject invention have been described and illustrated, it is obvious that various changes and modifications can be made therein without departing from the spirit of the present invention which should be limited only by the scope of the appended claims.

What is claimed is:

1. A fault locating device for connection within the tip and ring conductors of a customer's telephone line for determining whether a fault exists on the central office side or on the customer side of said fault locating device, said fault locating device comprising;
- a first voltage and current sensitive bilateral switching device connected in series with said tip conductor;
- a second voltage and current sensitive bilateral switching device connected in series with said ring conductor;
- each of said bilateral switching devices including a solid state silicone bilateral switch responsive to a predetermined threshold voltage to avalanche said switch and initiate conduction and responsive to a predetermined current flow therethrough to sustain conduction, said switch being responsive to pass both AC and DC voltages and currents normally encountered on said telephone line when said voltage exceeds said predetermined threshold level; and
- a distinctive termination circuit connected across said tip and ring line on the customer side of said fault locating device, said circuit including a blocking means for allowing current flow only in the direction from the ring line to the tip line.

2. The fault locating device of claim 1 wherein each of said bilateral switching devices includes a solid state bilateral switch having a first and a second terminal connected in series with the tip or ring conductors and a gate for rendering said bilateral switch fully conductive between said terminals in response to a gate trigger current, and a solid state avalanche device connected between said gate and said second terminal of said bilateral switch for rendering said bilateral switch voltage sensitive, said avalanche device being responsive to a predetermined threshold voltage to render said bilateral switch conductive between the gate and first terminal thereof in the presence of said threshold voltage, said bilateral switch being nonconductive below said threshold voltage.

3. The fault locating device of claim 2 wherein each of said bilateral switching devices include a means for suppressing voltage transients connected across the first and second terminals of said bilateral switch.

4. The fault locating device of claim 2 or 3 wherein each of said bilateral switching devices include a means for limiting current flow to said avalanche device.

5. The fault locating device of claim 1 wherein said bilateral switching devices are sidacs.

6. A maintenance termination device for use in a telephone tip and ring circuit, said device being transparent to ac and dc voltages normally encountered in a telephone circuit, said maintenance termination device providing a remote disconnect means for a telephone subscriber in response to a test voltage below a predetermined threshold voltage from a telephone central office, said maintenance termination device comprising:
- at least one solid state bilateral switch having a first and a second terminal connected in series with said remote telephone circuit, said bilateral switch having a gate responsive to a gate trigger current level to initiate conduction, and responsive to a switch hold current level to sustain conduction;
- a solid state avalanche device for each bilateral switch connected between the gate and the second terminal of the bilateral switch to render the bilateral switch voltage sensitive, said avalanche device being responsive to a predetermined threshold voltage level to render said bilateral switch conductive when said circuit current level exceeds said gate trigger current level;
- said bilateral switch being rendered nonconductive by dropping said circuit current level below said switch hold current level, and rendered conductive only by the application of a voltage above the predetermined threshold voltage level;
- a polarized termination circuit means connected across said tip and ring circuit on the subscriber side of said solid state bilateral switches to identify said device to said central office, said termination circuit including a blocking means to allow current flow only from ring to tip in the termination circuit;
- whereby the device at the remote location may be rendered nonconductive to selectively test the circuit to the remote location with voltages below said threshold voltage, and rendered conductive to selectively test a circuit through the subscriber telephone with voltages above said threshold, said device being verifiable by the application of a dc test voltage above said threshold in a polarity that provides current flow from ring to tip only.

7. The maintenance termination device of claim 6 further including means for suppressing voltage transients connected across the first and second terminals of each said bilateral switch.

8. The device of claim 7 wherein each of said bilateral switching devices include a means for limiting current flow to said avalanche device.

9. The device of claim 8 wherein said solid state bilateral switch is a triac.

10. The device of claim 9 wherein said solid state avalanche device is a diac.

11. The device of claim 10 further including a resistor connected between the gate and the first terminal of said bilateral switch.

12. The device of claim 11 wherein said solid state avalanche device includes two zener diodes connected back to back.

13. The device of claim 12 wherein said suppressing means include a resistor and a capacitor connected in series.

14. The device of claim 13 wherein said current limiting means is a resistor connected in series with said avalanche device between the gate and the second terminal of said bilateral switch.

15. The device of claim 14 wherein said distinctive termination circuit includes a resistor in series with a diode, said diode conducting from the ring to the tip conductor.

16. The device of claim 15 wherein said distinctive termination circuit includes a zenar diode connected in series and in the opposite polarity with said diode.

17. The fault locating device of claim 6 wherein said distinctive termination circuit includes at least one wiggle circuit means for producing an oscillation of a central office test meter when current is flowing through said circuit.

18. The fault locating device of claim 17 wherein said wiggle circuit includes means for preventing operation of said wiggle circuit below a predetermined threshold voltage.

19. The fault locating device of claim 18 wherein said termination circuit includes means for blocking conduction through said termination circuit below a predetermined threshold voltage.

20. The fault locating device of claim 19 wherein said threshold voltage blocking means includes a zener diode connected in series, and in the opposite polarity with, said diode.

21. The fault locating device of claim 17 wherein said wiggle circuit includes an oscillating circuit for alternately connecting a wiggle resistor in and out of said termination circuit to alternately increase and decrease the equivalent resistance of said termination circuit.

22. The fault locating device of claim 21 wherein said wiggle circuit includes a transistor having a collector and emitter connected across the tip and ring line with the wiggle resistor being connected to the collector thereof and a means for cyclically providing the base current for alternately turning said transistor on and off.

23. The fault locating device of claim 22 wherein said means for cyclically providing the transistor base current includes a solid state gate controlled switch, an avalanche device connected to the gate of said gate controlled switch to render said gate controlled switch conductive above a predetermined threshold voltage and a capacitor connected across said gate controlled switch.

24. The fault locating device of claim 23, wherein said wiggle circuit further includes means for rendering said termination circuit nonconductive to a.c. signals.

25. The fault locating device of claim 24, wherein said means for rendering said termination circuit a.c. nonconductive includes means for providing an a.c. impedance to the central office.

26. The fault locating device of claim 25, wherein said means for rendering said termination circuit a.c. nonconductive and for providing an a.c. signature includes a resistance-capacitance time constant circuit.

27. The fault locating device of claim 26, wherein said means for providing the transistor base current includes a silicone unilateral switch.

28. The fault locating device of claim 26, wherein said means for providing the transistor base current includes an oscillator to alternately render said transistor conductive and nonconductive at a fixed rate.

29. The fault locating device of claim 28, wherein said transistor is a phototransistor optically coupled by a LED to said oscillator.

30. A fault locating device of claim 17, wherein said wiggle circuit means alternately turns on and off each voltage sensitive switch individually.

31. A fault locating device for connection within a remote circuit, said device comprising:
a solid state switch means having at least one unilateral switch connected in series with said remote circuit;
oscillating means for alternately turning said unilateral switches on and off in response to a control voltage;
voltage monitoring means connected across said remote circuit for actuating said oscillating means; and
a termination circuit connected across said remote circuit being alternately connected in and out of said remote circuit in response to the unilateral switches being turned on and off;
whereby said device being normally transparent and conductive for both alternating and direct current and being selectively rendered conductive and nonconductive for test purposes by the application of said control voltage.

32. The fault locating device of claim 31 wherein said solid state switch means includes overcurrent protection means.

33. The fault locating device of claim 32 wherein said solid state switch means includes overvoltage protection means for limiting the voltage across tip and ring.

34. the fault locating device of claim 33 wherein said termination circuit includes a polarizing means.

35. The fault locating device of claim 34 wherein said unilateral switches are field-effect transistors.

36. The fault locating device of claim 35 wherein said solid state switch means includes a resistance-capacitance time constant circuit for normally energizing said FETs.

37. The fault locating device of claim 36, wherein each of said FETs include source, gate and drain terminals, said source and drain terminals being connected in series with its respective tip or ring circuit and said gate terminals being connected together.

38. The fault locating device of claim 37, wherein said resistance-capacitance circuit includes a resistor and a capacitor within a diode bridge connected across the tip and ring circuit for charging the capacitor in the proper polarity regardless of the polarity of the voltage across tip and ring.

39. The fault locating device of claim 38 further including a gate circuit voltage protection means including a zener diode connected across said capacitor to limit the voltage supplied to the gates of each FET.

40. The fault locating device of claim 39, wherein said overcurrent protection means includes a transistor and resistor circuit connected across the gate and source of each said FET said terminal being actuated in response to an overcurrent condition to de-energize said FET during the period the overcurrent condition is present.

41. The fault locating of claim 40, wherein said overvoltage protection means includes a gate controlled solid state switch for actuating a voltage limiting means in response to an overvoltage condition for the period said overvoltage condition is present.

42. The fault locating device of claim 31, wherein said voltage monitoring means includes means for blocking conduction to said oscillating means in response to a control voltage above said threshold voltage.

43. The fault locating device of claim 42, wherein said oscillating means includes at least one Schmitt Trigger Nand gate connected to the gate of said FETs for cyclically shorting the capacitor within said resistor-capacitor time constant circuit to de-energize said FETs.

44. A test system for sectionalizing the location of a fault on a tip and ring telephone line to determine whether the fault is located on a central office network line, a subscriber inside wire or beyond a subscriber extension jack, said system comprising:
a first fault locating device located at a demarcation point separating the central office network line from the subscriber inside wire;
a second fault locating device located at the subscriber extension jack;
each of said fault locating devices including a voltage and current sensitive bilateral switching device in each tip and ring line and a distinctive polarized termination circuit having at least one blocking means connected across said tip and ring line to permit conduction through said termination circuit only from ring to tip, said first and second bilateral switching devices having means responsive to a first and second predetermined threshold voltage for rendering said bilateral switching devices conductive only at voltages above their respective predetermined threshold voltage;

whereby said first fault locating device at a demarcation point which allows determination of a fault condition on the central office network line in response to a test voltage below the first threshold voltage of said first fault locating device;

said second fault locating device allowing determination of a fault condition within the subscriber inside wire in response to a test voltage above the first threshold voltage of the first fault locating device but below the sum of the first threshold voltage and the second threshold voltage of the second fault locating device;

said second fault locating device allowing the determination of a fault condition beyond the subscriber extension jack in response to a test voltage above the sum of first and second threshold voltages of said first and second fault locating devices.

45. The system of claim 44 for use in a multi-extension telephone system further including a plurality of said second fault locating devices located at each subscriber extension jack.

46. The system of claim 44 or 45 wherein each of said bilateral switching devices includes a solid state bilateral switch having a first and a second terminal connected in series with the tip or ring conductors and a gate for rendering said bilateral switch fully conductive between said terminals in response to a gate trigger current, and a solid state avalanche device connected between said gate and said second terminal of said bilateral switch for rendering said bilateral switch voltage sensitive, said avalanche device being responsive to a predetermined threshold voltage to render said bilateral switch conductive between the gate and first terminal thereof in the presence of said threshold voltage, said bilateral switch being nonconductive below said threshold voltage.

47. The system of claim 44 further including a third fault locating device located within a mainframe of the central office, whereby said third fault locating device allows the determination of a fault condition within the central office in response to a test voltage below the threshold voltage of said third fault locating device.

48. A test system for sectionalizing the location of a fault on a tip and ring telephone subscriber loop to determine whether the fault is located on a central office network line and a subscriber circuit; said test system comprising;

a central office test measurement system located within the central office;

a fault locating device connected in series within the subscriber loop, said device located at a demarcation point separating the central office network line and the subscriber circuit;

subscriber equipment connected within said subscriber circuit;

each of said fault locating devices including a voltage and current sensitive bilateral switching device in each tip and ring line and a distinctive polarized termination circuit having at least one diode connected across said tip and ring line which permits conduction through said termination circuit only from ring to tip, each of said bilateral switching devices having a means responsive to a predetermined threshold voltage for rendering said bilateral switching device conductive only at a voltage above said predetermined threshold voltage.

49. A priority exclusion system for a telephone circuit with multiple subscribers or data devices, said system comprising:

a first input for connecting said system to a telephone circuit, said input having at least a tip conductor and a ring conductor, with a talk battery voltage of at least 32 volts present therein;

at least two outputs, wherein each output services a separate telephone or data device, each of said outlets having at least a tip conductor and a ring conductor bridged across the tip and ring conductors of said first input;

an exclusion device mounted in series with each said output, each of said exclusion devices having at least one solid state voltage sensitive switch series mounted in one of said conductors, with each exclusion device conductive above approximately 32 volts and nonconductive below said voltage;

whereby the use of any output by a telephone or data device will draw the talk battery voltage in the telephone circuit below 32 volts which will exclude the entry into the telephone circuit by the other outlet(s).

50. A priority exclusion system as claimed in claim 49 wherein each exclusion device has a first and second voltage sensitive switch, with the first switch in the ring conductor and the second switch in the tip conductor, each switch responsive to a threshold of approximately 16 volts to initiate conduction.

51. A priority exclusion system as claimed in claim 49 wherein each exclusion device is a single voltage sensitive switch series mounted in either the ring or tip conductor, said switch responsive to a threshold of approximately 32 volts to initiate conduction.

* * * * *